(12) United States Patent
Nakatani et al.

(10) Patent No.: US 7,215,085 B2
(45) Date of Patent: May 8, 2007

(54) PLASMA DISPLAY DEVICE

(75) Inventors: Toshikuni Nakatani, Ibaraki (JP); Yukiharu Ito, Takatsuki (JP)

(73) Assignee: Matsushita Electric Industrial Co., Ltd., Osaka (JP)

( * ) Notice: Subject to any disclaimer, the term of this patent is extended or adjusted under 35 U.S.C. 154(b) by 379 days.

(21) Appl. No.: 10/517,163

(22) PCT Filed: Apr. 27, 2004

(86) PCT No.: PCT/JP2004/006072

§ 371 (c)(1),
(2), (4) Date: Dec. 7, 2004

(87) PCT Pub. No.: WO2004/097780

PCT Pub. Date: Nov. 11, 2004

(65) Prior Publication Data

US 2006/0061944 A1 Mar. 23, 2006

(30) Foreign Application Priority Data

Apr. 28, 2003 (JP) ............................. 2003-124200

(51) Int. Cl.
*G09G 3/28* (2006.01)
*H05K 1/00* (2006.01)
(52) U.S. Cl. ...................... 315/169.4; 345/60; 361/681
(58) Field of Classification Search ............. 315/169.4; 361/681; 345/60
See application file for complete search history.

(56) References Cited

U.S. PATENT DOCUMENTS 6,995,521 B2 * 2/2006 Okamura et al. ........ 315/169.4

FOREIGN PATENT DOCUMENTS

| JP | 7-326536 A | 12/1995 |
| JP | 2-807672 B2 | 7/1998 |
| JP | 2001-272944 A | 10/2001 |
| JP | 2002-26246 A | 1/2002 |
| JP | 2002-261448 A | 9/2002 |
| WO | WO 2004/097780 | 11/2004 |

OTHER PUBLICATIONS

International Search Report for PCT/JP2004/006072, dated Jul. 13, 2004.

* cited by examiner

*Primary Examiner*—Evan Pert
(74) *Attorney, Agent, or Firm*—RatnerPrestia

(57) ABSTRACT

A plasma display device which includes sustain circuit boards containing switching element-switching element. Respective sustain circuit boards are provided with a first wiring pattern for driving current, and a second wiring pattern in which the driving current proceeds in a direction that is opposite to that in the first wiring pattern. The above-described structure reduces parasitic inductance, and the voltage waveform to be applied on the plasma display device's panel will have reduced ringing phenomenon.

7 Claims, 10 Drawing Sheets

FIG. 3A
FIG. 3B
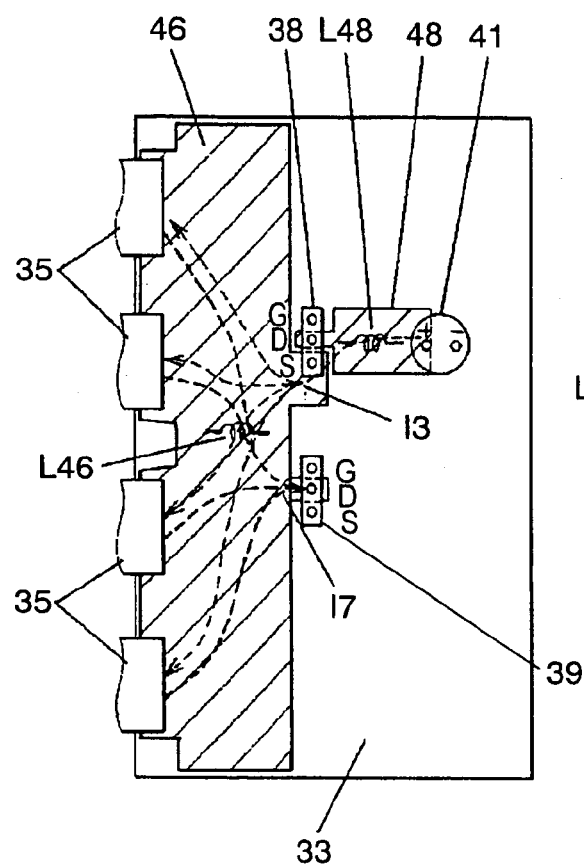
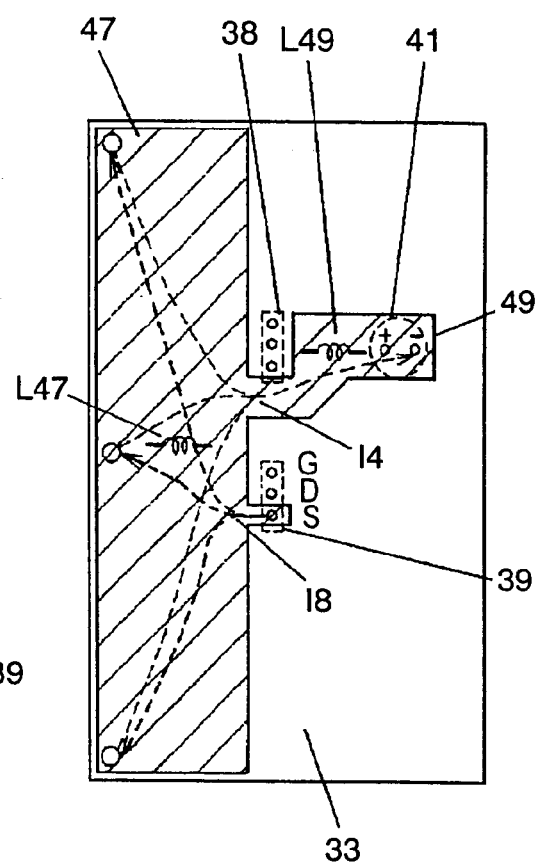

PLASMA DISPLAY DEVICE

This application is a U.S. National Phase application of PCT International application PCT/JP2004/006072.

TECHNICAL FIELD

The present invention relates to a plasma display device for displaying images in television receivers, computer terminals, etc.

BACKGROUND ART

Plasma display devices have been generally recognized as the display panel (flat display panel) of superior visibility. Further improvement efforts are being made towards still better picture quality of higher definition capability and still larger display sizes.

The plasma display devices can be divided into an AC type and a DC type in terms of the driving method, and a surface discharge type and an opposed discharge type in terms of the discharge pattern. Because of advantages in offering a higher resolution display and implementing larger display sizes, as well as the ease of manufacture, those plasma display devices of AC surface discharge type are forming the main stream in the industry.

The plasma display devices of the above-described type include a pair of transparent glass substrates and a discharge space formed between the glass substrates. A plasma display panel, which is the glass substrate on which a group of electrodes is disposed, (hereinafter, the plasma display panel is referred to as panel), a chassis for holding the panel, and a driver circuit block attached on the chassis for applying display signals to the panel constitute a panel module. The panel module is encased to complete a finished plasma display device.

Structure of the display panel of plasma display device is described with reference to FIG. 8. As shown in FIG. 8, display electrode 2, which is a pair formed of scan electrode and sustain electrode, is provided for a plurality of lines in a stripe pattern on transparent front glass substrate 1. Group of the display electrodes is covered with dielectric layer 3, and protection film 4 is provided to protect the dielectric layer.

On the surface of back board 5, which is disposed opposed to front board 1; address electrode 7 covered with overcoat layer 6 is provided for a plurality of lines in a stripe pattern perpendicularly to display electrode 2, which display electrode being formed of a scan electrode and a sustain electrode. On overcoat layer 6, a plurality of barrier ribs 8 is provided in parallel to address electrode 7 so that one barrier rib is locating at each of the places between address electrodes 7. Barrier rib 8 at its side-wall surfaces and the surface of overcoat layer 6 are covered with phosphor layer 9.

Board 1 and board 5 are disposed opposed, and sealed around the circumference so that display electrode 2 consisting of a scan electrode and a sustain electrode is at right angles to address electrode 7, and micro discharge spaces are provided in between the opposing display electrode 2 and address electrode 7. The discharge space is filled with one of discharge gases among the group of helium, neon, argon and xenon gases, or a mixture thereof. Discharge space is divided by barrier ribs 8 into a plurality of sections to provide a plurality of individual discharge cells, each of the individual discharge cells having display electrode 2 and address electrode 7 disposed crosswise perpendicularly. The individual discharge cells are provided with phosphor layer 9; one cell with red phosphor, the next cell with green phosphor and the third cell with blue phosphor, in the order.

FIG. 9 shows layout arrangement of the electrodes in the panel. As illustrated in FIG. 9, the scan electrodes and sustain electrodes, and address electrodes are disposed in a matrix, M rows by N columns. Scan electrodes $SCN_1$–$SCN_M$ as well as sustain electrodes $SUS_1$–$SUS_M$ are provided for M rows, whereas address electrodes $D_1$–$D_N$ are provided for N columns.

In the panel of the above-described electrode structure, when a pulse is applied between an address electrode and a scan electrode, an address discharge takes place between the address electrode and the scan electrode; thus a discharge cell is selected. A cyclically reversing sustain pulse applied between the scan electrode and the sustain electrode produces a sustain discharge between the scan electrode and the sustain electrode. A certain specific display is generated through the above procedures.

FIG. 10 shows a plasma display device which includes the above panel; the drawing is used to show the layout arrangement how the main circuit boards are disposed. FIG. 12 is an electrically equivalent circuit diagram representing the above plasma display device. As shown in FIG. 10, panel 11 is glued to supporting board 12 for ensuring a certain mechanical strength. Now, reference is made to FIG. 12; panel 11's scan electrode group 11a is connected to sustain circuit board 14 via flexible connector board 13, while sustain electrode group 11b is connected to sustain circuit board 15 via flexible connector board 13.

Sustain circuit board 14 is mounted with switching elements 16, 17 for driving panel 11 and smoothing capacitor 18 for supplying the pulse current. Sustain circuit board 15 is mounted with switching elements 19, 20 for driving panel 11 and smoothing capacitor 21 for supplying the pulse current.

Sustain circuit boards 14, 15 are mechanically attached to conductive board 23 by means of respective conductive supporting members 22, and are electrically connected too. Further, sustain circuit boards 14, 15 are connected with power supply circuit 24 via wiring members 25, 26; sustain circuit boards 14, 15 are supplied with a voltage from power supply circuit 24.

In the above plasma display device, sustain pulse is outputted from sustain circuit board 14 and sustain circuit board 15 alternately to be applied on the scan electrode group and the sustain electrode group, as shown in FIG. 11. In this way, panel 11 is supplied with driving current.

The above-described technology has been disclosed in Japanese Patent No. 2807672.

In the above described conventional plasma display device, driving current proceeds along the route shown in FIG. 12. Term t1 represents a term for applying a sustain pulse on scan electrode group 11a. The driving current proceeds from the positive electrode of smoothing capacitor 18 to panel 11 via switching element 16. From panel 11, the driving current further proceeds to switching element 20 and to conductive board 23, and returns to smoothing capacitor 18, or the starting point, at the negative electrode.

Term t2 represents a term for applying a sustain pulse on sustain electrode group 11b. The driving current proceeds from the positive electrode of smoothing capacitor 18 to panel 11 via switching element 19. From panel 11, the driving current further proceeds to switching element 17 and to conductive board 23, and returns to smoothing capacitor 18, or the starting point, at the negative electrode. Referring to FIG. 12, there exists capacitance component C in each of the discharge cells of panel 11, and parasitic inductance L1–L15 at a number of constituent members.

As FIG. 12 shows, there are parasitic inductance L1–L15 in the current path formed of panel 11, sustain circuit boards 14, 15 and conductive board 23. As the result, when there is a driving current of great di/dt value during the sustain operation for panel 11, it causes a large ringing phenomenon at the starting moment of the driving current in the voltage waveform to be applied on the electrode group of panel 11, as shown in FIG. 11. This results in a lowered voltage applied on panel 11, narrowing a margin in the operating voltage of panel 11.

DISCLOSURE OF INVENTION

The present invention reduces the parasitic inductance in a plasma display device, and reduces the ringing phenomenon in the voltage waveform to be applied on the panel.

A plasma display device in the present invention includes a circuit board containing switching element, for supplying driving current to a panel. The circuit board is featured in that it has a first wiring pattern for supplying a driving current and a second wiring pattern, which second wiring pattern is provided so that it opposes to the first wiring pattern and the driving current proceeds in a direction that is opposite to that of the first wiring pattern.

BRIEF DESCRIPTION OF THE DRAWINGS

FIG. 3 shows plan view of wiring pattern formed on other sustain circuit board of plasma display device in the present invention.

BEST MODE FOR CARRYING OUT THE INVENTION

A plasma display device in accordance with an exemplary embodiment of the present invention is described referring to FIG. 1–FIG. 7.

Figure 1:
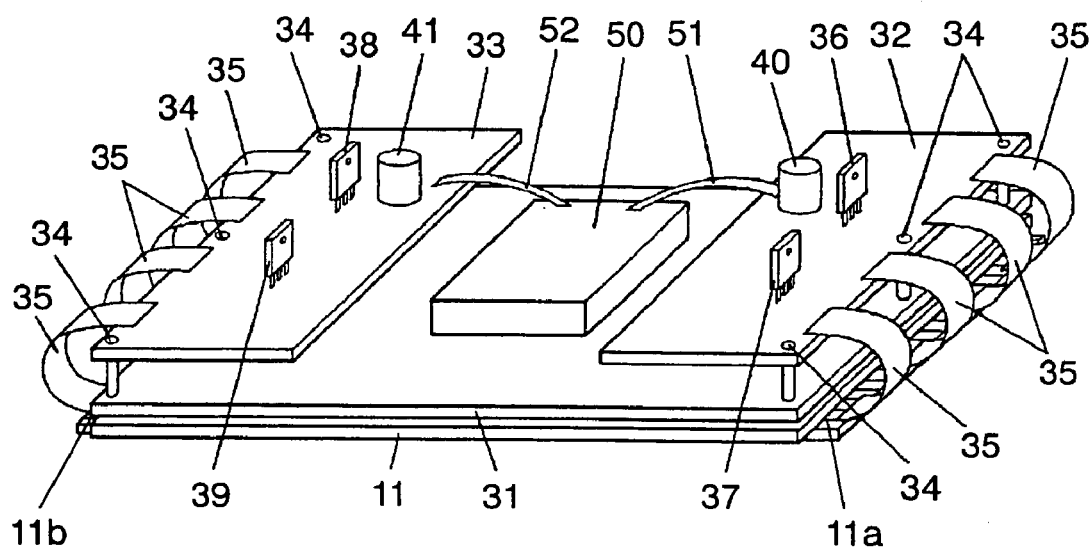
FIG. 1 is a perspective view showing the main structure of a plasma display device in accordance with an exemplary embodiment of the present invention.

FIG. 1 shows a structure how the circuit boards are disposed in the plasma display device in the present embodiment.

Panel 11 is glued to and supported by chassis board 31 made of aluminum or the like conductive material, via a heat conductive member.

Sustain circuit boards 32, 33 are attached on chassis board 31 using a bolt or the like conductive supporting member 34, and connected with panel 11's scan electrode group 11a and sustain electrode group 11b by means of a plurality of flexible connector boards 35. Respective sustain circuit boards 32, 33 are mounted with MOSFET or the like switching elements 36–39 for driving panel 11, and smoothing capacitors 40, 41 for supplying the pulse currents.

FIG. 2 shows plan view of wiring pattern formed on a sustain circuit board of the plasma display device in the present invention.

Figure 2A:
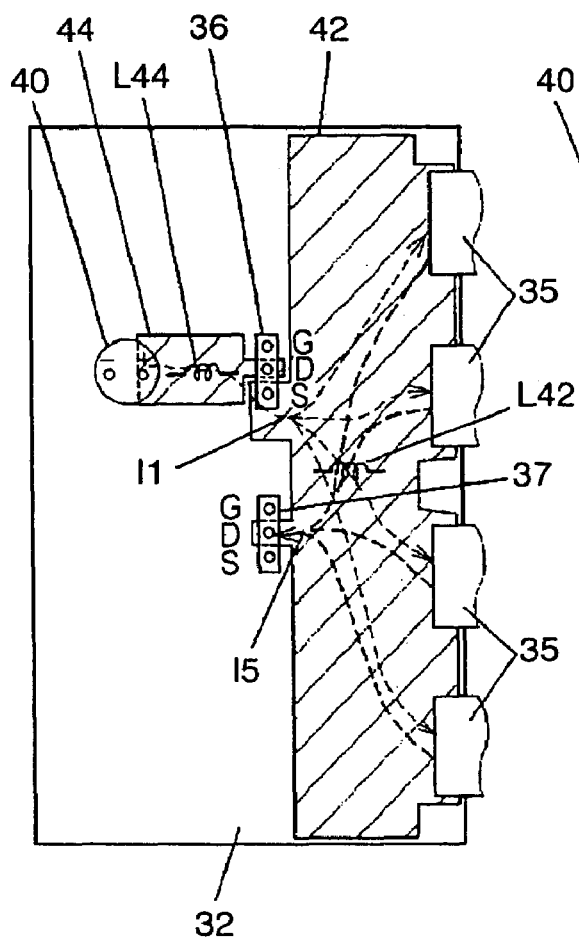
FIG. 2 shows plan view of wiring pattern formed on a sustain circuit board of plasma display device in the present invention.
Figure 2B:
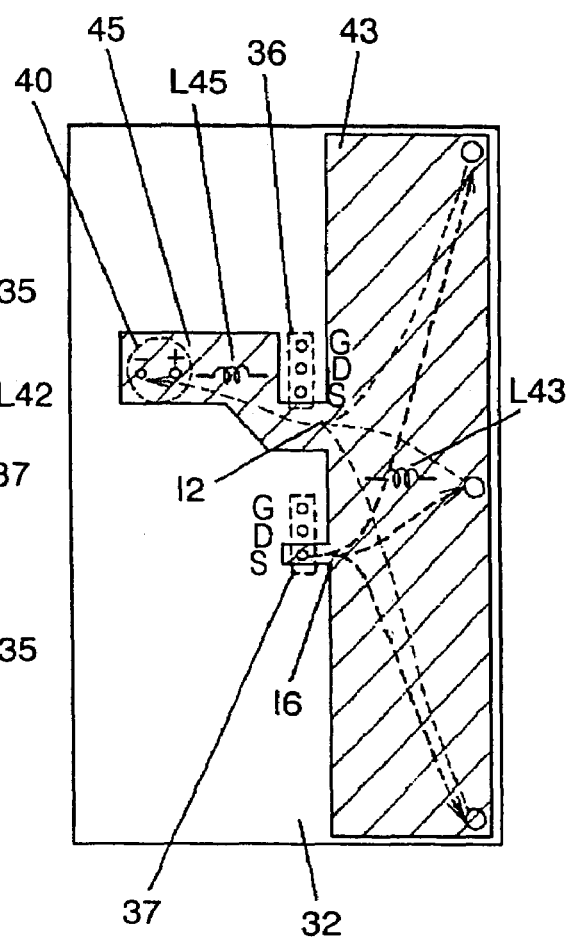

Sustain circuit board 32 has, on the same surface where switching elements 36, 37 and smoothing capacitor 40 are mounted, first wiring pattern 42 connected with flexible connector board 35 for connection with panel 11's electrodes, as shown in FIG. 2A. On the reverse surface of the board, second wiring pattern 43 is formed opposing to first wiring pattern 42, as shown in FIG. 2B. Further on the mounting surface, third wiring pattern 44 is formed for connecting smoothing capacitor 40 with switching element 36, as shown in FIG. 2A; while on the reverse surface, fourth wiring pattern 45 is formed integrated with second wiring pattern 43 in a manner that it opposes to third wiring pattern 44, as shown in FIG. 2B. Sustain circuit board 32's wiring pattern 43 is grounded to chassis board 31 via a bolt used for attaching sustain circuit board 32 on chassis board 31.

FIG. 3 shows plan view of wiring pattern formed on another sustain circuit board of the plasma display device.

Sustain circuit board 33 has, on the same surface where switching elements 38, 39 and smoothing capacitor 41 are mounted, first wiring pattern 46 connected with connection with flexible connector board 35 for connection with panel 11's electrodes, as shown in FIG. 3A. On the reverse surface of the board, second wiring pattern 47 is formed opposing to first wiring pattern 46, as shown in FIG. 3B. Further on the mounting surface, third wiring pattern 48 is formed for connecting smoothing capacitor 41 with switching element 38, as shown in FIG. 3A; while on the reverse surface, fourth wiring pattern 49 is formed integrated with second wiring pattern 47 in a manner that it opposes to third wiring pattern 48, as shown in FIG. 3B. Sustain circuit board 33's wiring pattern 47 is grounded to chassis board 31 via a bolt used for attaching sustain circuit board 33 on chassis board 31.

Power supply circuit 50 shown in FIG. 1 is for supplying a voltage to sustain circuit boards 32, 33, and connected with said sustain circuit boards 32, 33 via wiring members 51, 52.

Figure 4:
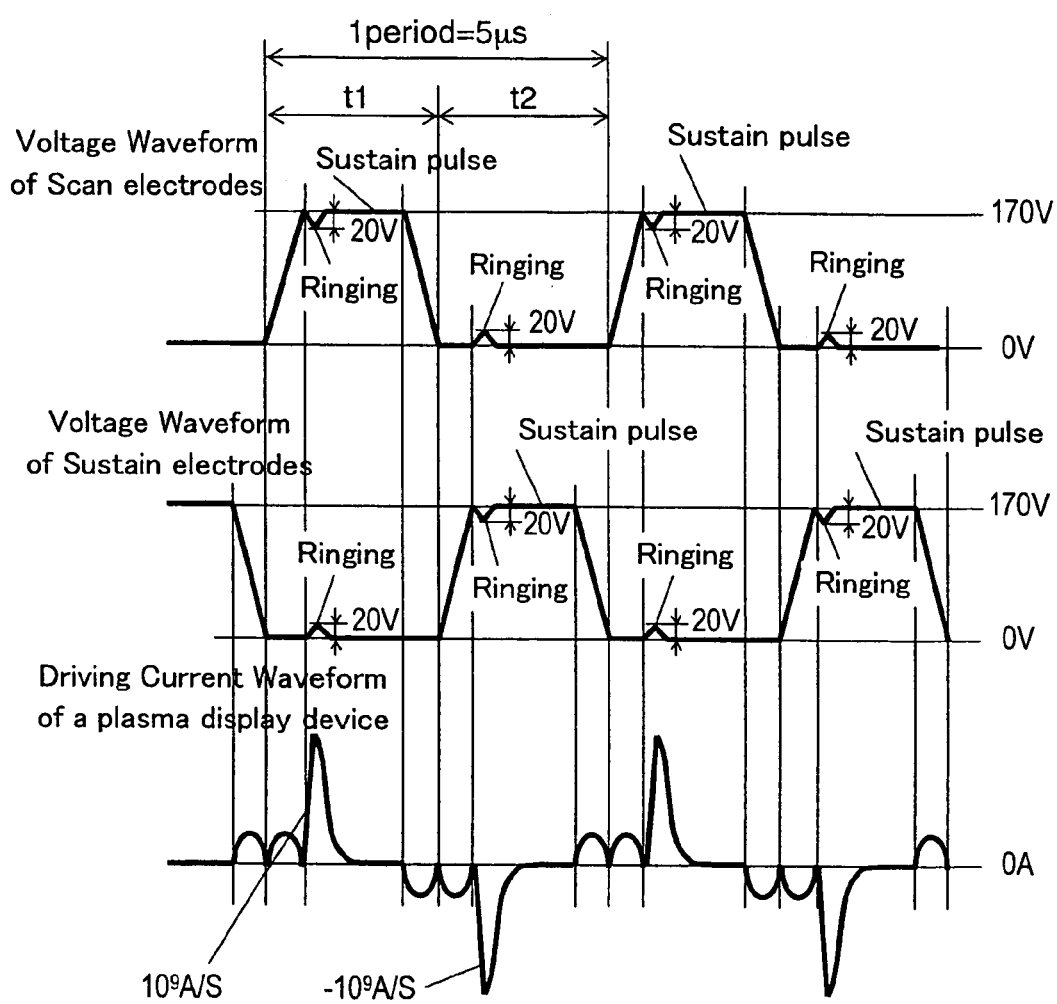
FIG. 4 shows a driving waveform in a plasma display device in the present invention.

FIG. 4 is a driving waveform chart of a plasma display device in accordance with the present invention.

In the above plasma display device, sustain circuit board 32 and sustain circuit board 33 output the sustain pulse alternately to be applied on the scan electrode group and the sustain electrode group. Panel 11 is supplied with driving current in this way. The driving current has a pulse waveform and a great di/dt value. In an example with a 42-inch size panel, the di/dt of driving current reaches as high as approximately $10^9$ A/S.

Figure 5:
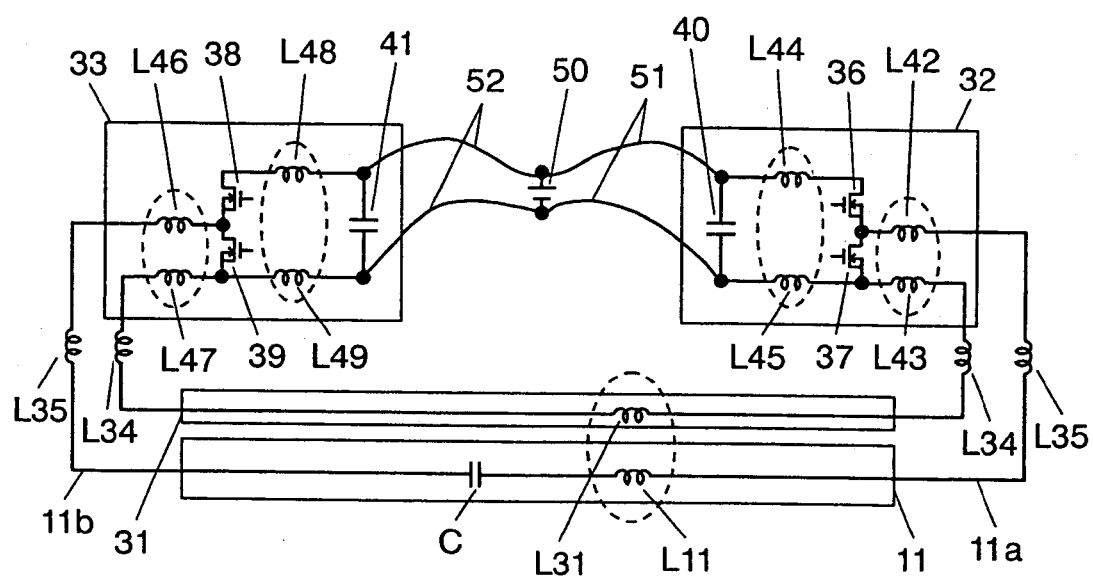
FIG. 5 shows an electrically-equivalent circuit diagram of a plasma display device in the present invention.

FIG. 5 is an electrically-equivalent circuit diagram of a plasma display device in the present invention. Cruising course of the driving current in the plasma display device in the present embodiment is described in the following referring to FIG. 5.

Term t1 represents a term for applying a sustain pulse on scan electrode group 11a. Current for driving a plasma display device leaves smoothing capacitor 40's positive electrode, makes a cruise on sustain circuit board 32's wiring pattern 44 having parasitic inductance L44, and comes into switching element 36. The driving current continues cruising from switching element 36 on sustain circuit board 32's wiring pattern 42 having parasitic inductance L42, and reaches panel 11 which has electrode group's parasitic inductance L11 and cell group's capacitance component C, via flexible connector board 35 having parasitic inductance L35. And then, the driving current proceeds from panel 11 to flexible connector board 35 having parasitic inductance L35, cruises on sustain circuit board 33's wiring pattern 46 having parasitic inductance L46, and comes into switching element 39. The driving current further proceeds on sustain circuit board 33's wiring pattern 47 having parasitic inductance L47, and flows into chassis board 31 having parasitic inductance L31 via a bolt or the like conductive supporting member 34 having parasitic inductance L34. From chassis board 31, the driving current makes further trip through conductive supporting member 34 having parasitic inductance L34, on sustain circuit board 32's wiring pattern 43 having parasitic inductance L43, and on sustain circuit board 32's wiring pattern 45 having parasitic inductance L45. Finally, the driving current returns to the starting point, or smoothing capacitor 40 at the negative electrode. As described in the above, there is a substantial number of parasitic inductances existing in the cruising route of a current for driving plasma display device.

Therefore, as shown in FIG. 2, wiring pattern 44 for the route from smoothing capacitor 40 to switching element 36 and wiring pattern 42 for the route from switching element 36 to flexible connector board 35 are formed on the mounting surface of sustain circuit board 32; while on the reverse surface, viz. the soldering surface, wiring pattern 43, 45 for the route from conductive supporting member 34 to smoothing capacitor 40 is formed opposing to said wiring pattern 42, 44. Furthermore, a place for connection with panel 11 via flexible connector board 35 and a place for connection with chassis board 31 by means of conductive supporting member 34 are located in edge area at the same side of sustain circuit board 32.

Under the above-described configuration, wiring pattern 44's parasitic inductance L44 and wiring pattern 45's parasitic inductance L45 are equivalently reduced, because the respective driving current I1 and driving current I2 proceed towards opposite directions in proximity to each other, forming a negative mutual inductance. Wiring pattern 42's parasitic inductance L42 and wiring pattern 43's parasitic inductance L43 are equivalently reduced likewise, because driving current I1 and driving current I2 proceed towards opposite directions in proximity and a negative mutual inductance is formed.

As shown in FIG. 3, wiring pattern 48 for the route from smoothing capacitor 41 to switching element 38 and wiring pattern 46 for the route from switching element 38 to flexible connector board 35 are formed on the mounting surface of sustain circuit board 33; while on the reverse surface, viz. the soldering surface, wiring pattern 47, 49 for the route from conductive supporting member 34 to smoothing capacitor 41 is formed opposing to said wiring patterns 46, 48. Furthermore, a place for connection with panel 11 via flexible connector board 35 and a place for connection with chassis board 31 by means of conductive supporting member 34 are located in edge area at the same side of sustain circuit board 33.

Under the above-described configuration, wiring pattern 46's parasitic inductance L46 and wiring pattern 47's parasitic inductance L47 are equivalently reduced, because the respective driving current I3 and driving current I4 proceed towards opposite directions in proximity to each other, forming a negative mutual inductance.

In the same manner, term t2 represents a term for applying a sustain pulse on sustain electrode group 11b. Current for driving a plasma display device leaves smoothing capacitor 41's positive electrode, cruises on sustain circuit board 33's wiring pattern 48 having parasitic inductance L48, and comes into switching element 38. From switching element 38, the driving current further makes a trip on sustain circuit board 33's wiring pattern 46 having parasitic inductance L46, and flows into panel 11 having parasitic inductance L11 of the electrode group and capacitance component C of cell group via flexible connector board 35 having parasitic inductance L35. From panel 11, the driving current makes a cruise on sustain circuit board 32's wiring pattern 42 having parasitic inductance L42 via flexible connector board 35 having parasitic inductance L35, and comes into switching element 37. The driving current further proceeds on sustain circuit board 32's wiring pattern 43 having parasitic inductance L43, and flows into chassis board 31 having parasitic inductance L31 via a bolt or the like conductive supporting member 34 having parasitic inductance L34. And then, from chassis board 31, the driving current trips through conductive supporting member 34 having parasitic inductance L34, proceeds on sustain circuit board 33's wiring pattern 47 having parasitic inductance L47, and on sustain circuit board 33's wiring pattern 49 having parasitic inductance L49, finally returns to the starting point, or smoothing capacitor 41 at the negative electrode.

There is a substantial number of parasitic inductances existing also in the above described route of driving current. However, influence due to the parasitic inductance can be reduced likewise.

Namely, wiring pattern 48 for the route from smoothing capacitor 41 to switching element 38 and wiring pattern 46 for the route from switching element 38 to flexible connector board 35 are formed on the mounting surface of sustain circuit board 33; while on the reverse surface, viz. the soldering surface, wiring pattern 47, 49 for the route from conductive supporting member 34 to smoothing capacitor 41 is formed opposing to said wiring pattern 46, 48. Furthermore, a place for connection with panel 11 via flexible connector board 35 and that with chassis board 31 by means of conductive supporting member 34 are located in edge area at the same side of sustain circuit board 33.

Under the above-described configuration, wiring pattern 48's parasitic inductance L48 and wiring pattern 49's parasitic inductance L49 are equivalently reduced, because the respective driving current I3 and driving current I4 proceed towards opposite directions in proximity to each other, forming a negative mutual inductance. Wiring pattern 46's parasitic inductance L46 and wiring pattern 47's parasitic inductance L47 are equivalently reduced likewise, because driving current I3 and driving current I4 flow towards opposite directions in proximity to each other, forming a negative mutual inductance.

On the mounting surface of sustain circuit board 32, wiring pattern 42 for the route from flexible connector board 35 to switching element 37 is formed. While on the soldering surface, wiring pattern 43 for the route from switching element 37 to conductive supporting member 34 is formed opposing said wiring pattern 42. Furthermore, a place for connection with panel 11 via flexible connector board 35 and that with chassis board 31 by means of conductive supporting member 34 are located in edge area at the same side of sustain circuit board 32.

Under the above-described configuration as shown in FIG. 2, wiring pattern 42's parasitic inductance L42 and wiring pattern 43's parasitic inductance L43 are equivalently reduced, because the respective driving current I5 and driving current I6 proceed opposite directions in proximity to each other, forming a negative mutual inductance. Thus, the parasitic inductance at sustain circuit boards 32, 33 is significantly reduced.

At sustain circuit board 33, wiring pattern 46's parasitic inductance L46 and wiring pattern 47's parasitic inductance L47 are equivalently reduced, because the respective driving current I7 and driving current I8 proceed opposite directions in proximity to each other, forming a negative mutual inductance.

Now reference is made to FIG. 5, chassis board 31 is disposed to be close to the sustain electrode group locating in the inside of panel 11. During the respective terms t1 and t2 in FIG. 4, parasitic inductance L11 of panel 11's electrode group and parasitic inductance L31 of chassis board 31 are equivalently reduced, because the respective driving currents proceed opposite directions in proximity to each other, forming a negative mutual inductance. Thus, parasitic inductance L11 of panel 11's electrode group and parasitic inductance L31 of chassis board 31 reduce significantly.

As described in the above, respective parasitic inductances, L44 and L45, L42 and L43, L48 and L49, L46 and L47, and L11 and L31, form negative mutual inductance; so, the parasitic inductance of a driving current route is significantly reduced. Therefore, even if it encountered a driving current of great di/dt value, a ringing in the voltage waveform, which is to be applied on panel 11's electrode group, can be suppressed to be small.

Practical example is described with a device of 42-inch size panel. Ringing was approximately 50V in a conventional device. However, in a device in accordance with the present invention where a both-faced board having a 1.6 mm thick insulation layer and a 5 mm gap between the electrode group within panel and the chassis board is used for circuit board, ringing in the voltage for scan electrode group and sustain electrode group has been reduced to approximately 20V.

Although the wiring patterns formed on the upper surface and the lower surface of a circuit board are shown in FIG. 2 and FIG. 3 to have almost identical shapes opposing to each other, it is not the intention to limit the shape of wiring pattern as such. The wiring pattern may take any other different shapes, in so far as they are disposed opposed in part.

For example, in a case where wiring pattern 43, 47 has been formed covering the entire area of soldering surface, driving current proceeds in wiring pattern 43, 47 along the route defined by a region that is opposing to wiring pattern 42, 44 or wiring pattern 46, 48 provided on the mounting surface. Therefore, the present exemplary case offers the same advantage as that in the present embodiment. These wiring pattern arrangements produce a negative mutual inductance to generate the lowest impedance through the current path.

Although the present embodiment exemplified only a case in which the conductive supporting member is provided only at an edge area of circuit board where it is making contact with the flexible connector board, the conductive supporting member may be provided also at the other edge area that is remote from the flexible connector board. In the latter configuration, most of the driving current in the circuit board and the conductive board takes a route that is easy to produce a negative mutual inductance between the wiring patterns of a circuit board and between the panel and the chassis board. Namely, the driving current takes the route of the conductive supporting member disposed in an edge area at which the flexible connector board is placed. Thus, the same advantage as that of the present embodiment is offered.

Figure 6:
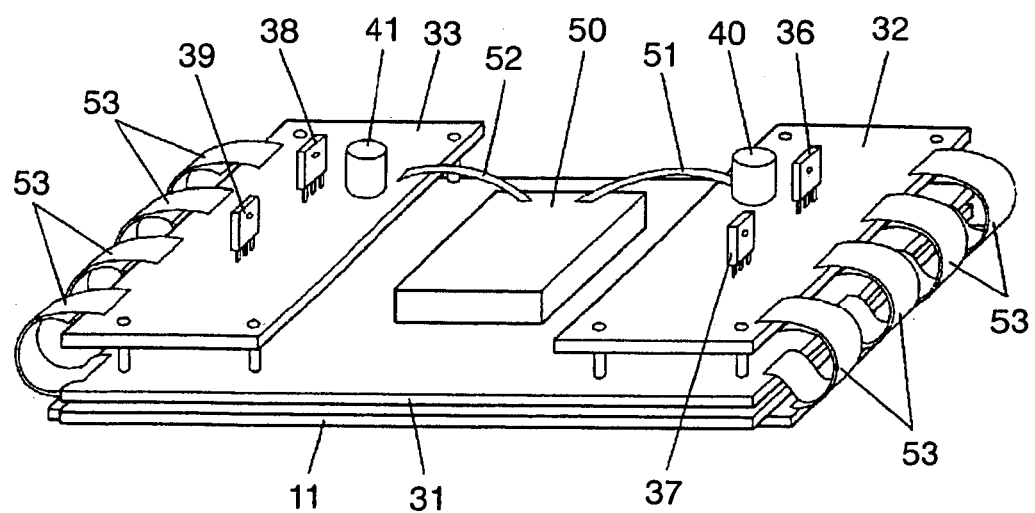
FIG. 6 is a perspective view showing the main structure of a plasma display device in accordance with other exemplary embodiment of the present invention.
Figure 7:
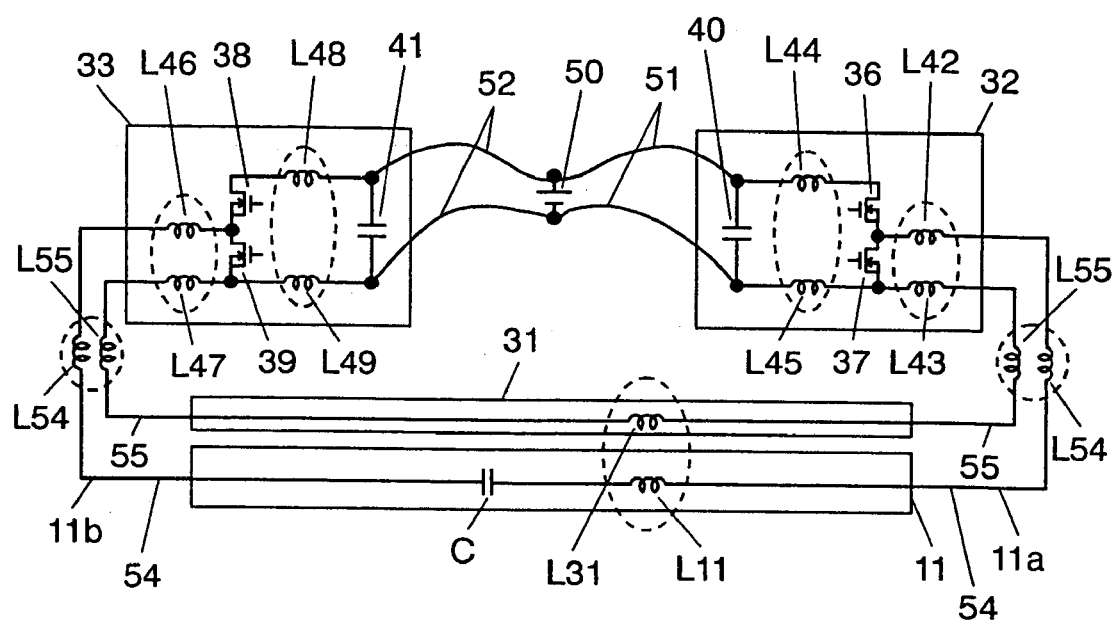
FIG. 7 is an electrically-equivalent circuit diagram of a plasma display device in accordance with other exemplary embodiment of the present invention.
Figure 8:
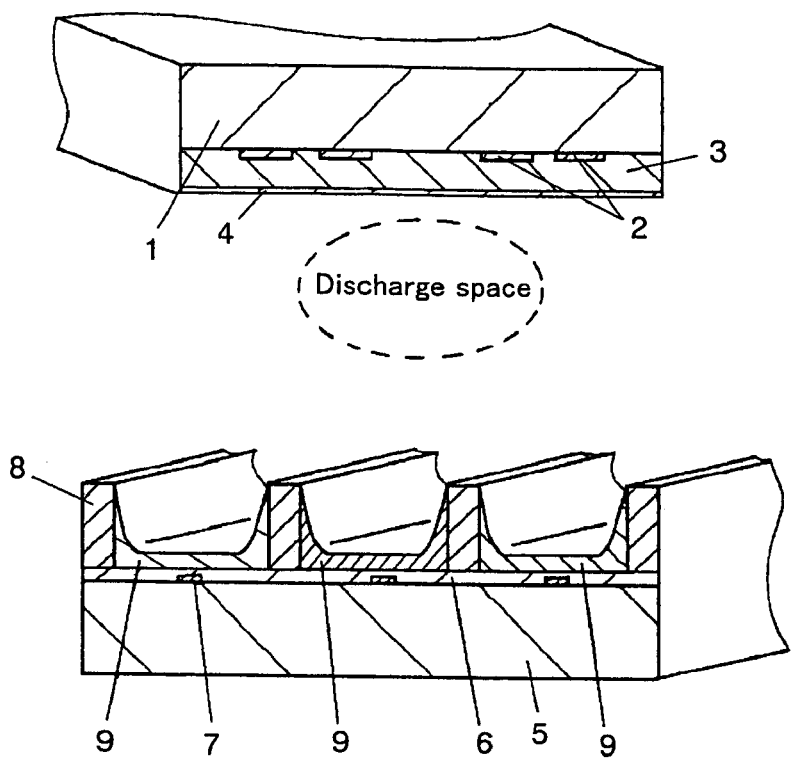
FIG. 8 is a perspective view showing a conventional plasma display panel.
Figure 9:
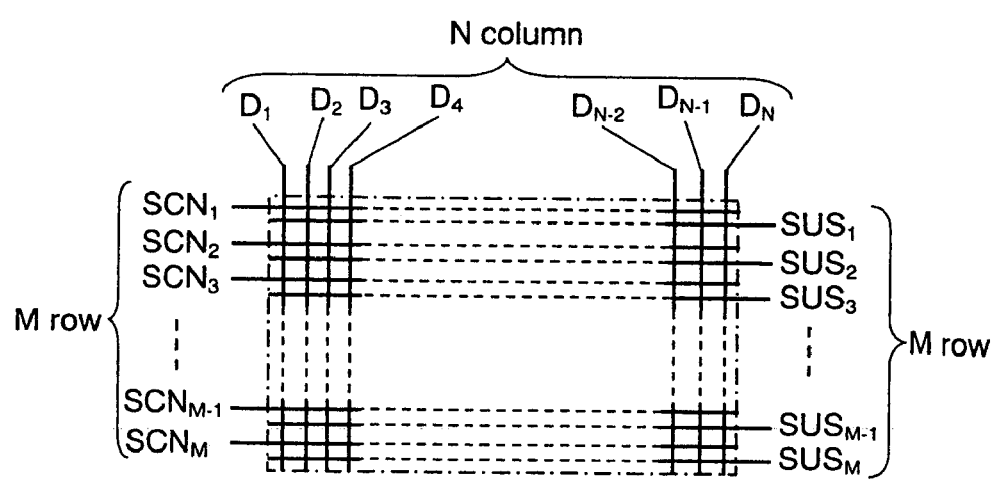
FIG. 9 shows a conventional electrical wiring diagram.
Figure 10:
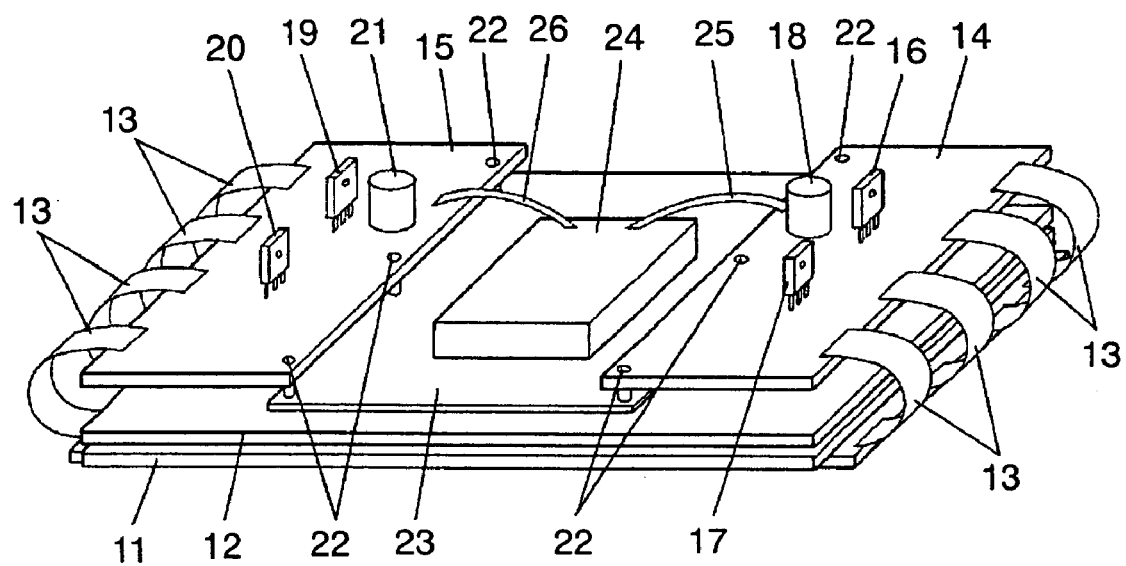
FIG. 10 is a perspective view showing a conventional plasma display panel.
Figure 11:
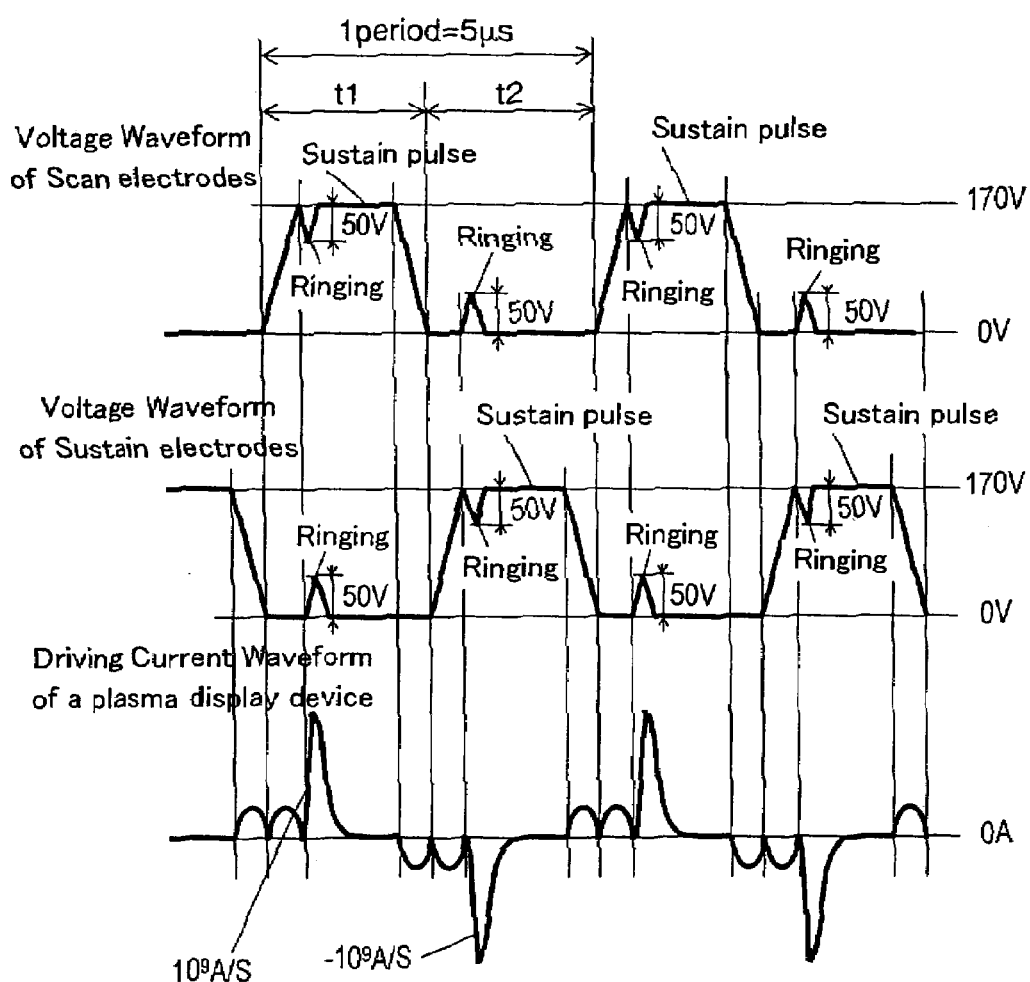
FIG. 11 shows a driving waveform in a conventional plasma display device.
Figure 12:
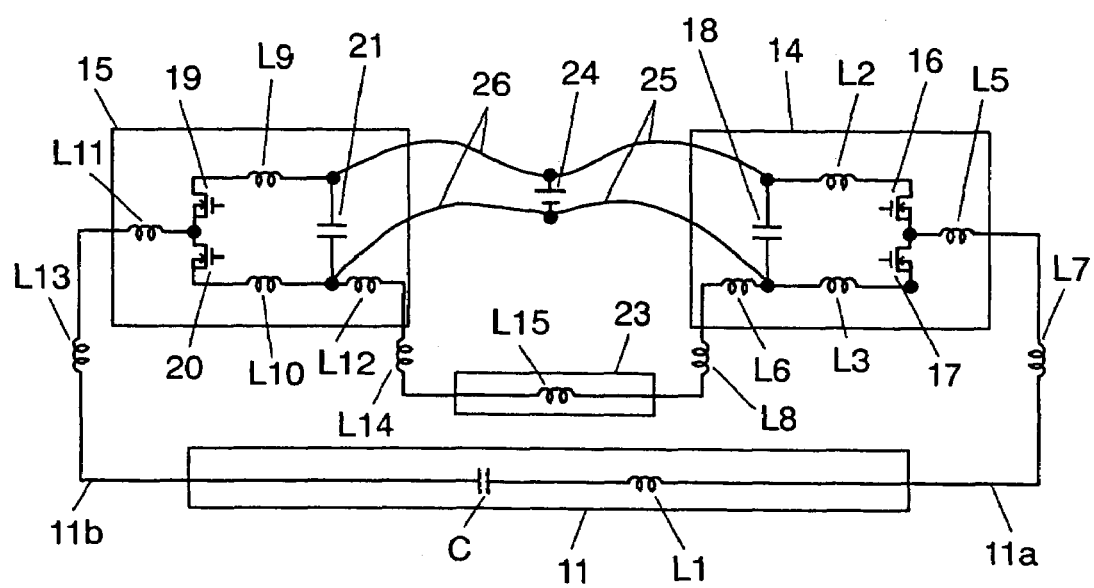
FIG. 12 is an electrically-equivalent circuit diagram of a conventional plasma display device.

FIG. 6 and FIG. 7 illustrate another plasma display device in accordance with other exemplary embodiment of the present invention. The plasma display device shown in FIG. 6 and FIG. 7 uses flexible connector board 53 having double-layered wiring pattern. One wiring pattern 54 of flexible connector board 53 is connected with panel 11's electrode and wiring pattern 42, 46 of sustain circuit board 32, 33. The other wiring pattern 55 is for grounding wiring pattern 43, 47 of sustain circuit board 32, 33 with chassis board 31.

In the above configuration, driving currents in wiring pattern 54 at the first layer and wiring pattern 55 at the second layer of flexible connector board 53 proceed in opposite directions to each other, as illustrated in FIG. 7, and a negative mutual inductance is produced. Thereby, parasitic inductance L54 at the first layer and parasitic inductance L55 at the second layer of flexible connector board are equivalently reduced. So, ringing in the voltage waveform to be applied on the electrode group of panel 11 can be suppressed still further. Experimental results conducted with 42-inch size panel show that the ringing in the voltage to be applied on scan electrode group and sustain electrode group can be reduced to as low as approximately 15V in accordance with the structure of the present embodiment.

INDUSTRIAL APPLICABILITY

The parasitic inductance in a circuit board can be made smaller and the ringing phenomenon in voltage waveform applied on a panel can be reduced in accordance with the present invention. As the result, a margin needed in the operating voltage for a panel can be improved. Thus the plasma display devices in the present invention can be used for displaying images in television receivers and computer terminals as well.

The invention claimed is:

1. A plasma display device comprising
a circuit board containing a switching element for supplying driving current to a plasma display panel; wherein
the circuit board is provided with a first wiring pattern for leading the driving current, and a second wiring pattern formed opposed to the first wiring pattern, in which second wiring pattern, the driving current proceeds in a direction that is opposite to that in the first wiring pattern.

2. A plasma display device comprising
a conductive board for holding a plasma display panel, and
a circuit board grounded to the conductive board, the circuit board containing a switching element for supplying driving current to the plasma display panel; wherein
the circuit board is provided with a first wiring pattern for connecting the plasma display panel with the switching element, and a second wiring pattern formed opposed to the first wiring pattern for connecting the conductive board with the switching element, in the second wiring pattern, the driving current proceeds in a direction that is opposite to that in the first wiring pattern.

3. A plasma display device comprising
a conductive board for holding a plasma display panel,
a circuit board attached to the conductive board, the circuit board containing a switching element for supplying driving current to the plasma display panel, and
a plurality of wiring boards for connecting the circuit board with an electrode of the panel; wherein
the circuit board is provided with a first wiring pattern for connecting the plasma display panel with the switching element and a second wiring pattern formed opposed to the first wiring pattern for connecting the conductive board with the switching element, wherein in the second wiring pattern, the driving current proceeds in a direction that is opposite to that in the first wiring pattern, and the wiring board is provided with a further wiring pattern for grounding the circuit board the conductive board.

4. The plasma display device of claim 2 wherein
the circuit board is provided with a capacitor connected with a switching element, the circuit board is further provided with a third wiring pattern for connecting the capacitor with the switching element, and a fourth wiring pattern disposed opposed to the third wiring pattern for connecting the conductive board the capacitor, wherein, in the fourth wiring pattern, the driving current proceeds in a direction that is opposite to that in the third wiring pattern.

5. The plasma display device of claim 2 wherein
the driving current in the plasma display panel proceeds in a direction that is opposite to that in the conductive board.

6. The plasma display device of claim 3, wherein
the circuit board is provided with a capacitor connected with a switching element, the circuit board is further provided with a third wiring pattern for connecting the capacitor with the switching element, and a fourth wiring pattern disposed opposed to the third wiring pattern for connecting the conductive board the capacitor, wherein, in the fourth wiring pattern, the driving current proceeds in a direction that is opposite to that in the third wiring pattern.

7. The plasma display device of claim 3 wherein
the driving current in the plasma display panel proceeds in a direction that is opposite to that in the conductive board.

* * * * *

UNITED STATES PATENT AND TRADEMARK OFFICE
CERTIFICATE OF CORRECTION

| | | |
|---|---|---|
| PATENT NO. | : 7,215,085 B2 | Page 1 of 1 |
| APPLICATION NO. | : 10/517163 | |
| DATED | : May 8, 2007 | |
| INVENTOR(S) | : Toshikuni Nakatani et al. | |

It is certified that error appears in the above-identified patent and that said Letters Patent is hereby corrected as shown below:

Title Page, Item (56) References Cited, FOREIGN PATENT DOCUMENTS
Change "WO    WO 2004/097780      11/2004"
to -- WO     2004/097780      11/2004 --

Column 8
Line 49, delete "in which" and insert -- wherein, in the --

Signed and Sealed this

Twenty-eighth Day of August, 2007

JON W. DUDAS
*Director of the United States Patent and Trademark Office*